US012776770B2

(12) United States Patent
Abdali Mashhadi et al.

(10) Patent No.: US 12,776,770 B2
(45) Date of Patent: Oct. 27, 2026

(54) TEMPERATURE DEPENDENT DRIVING OF GATE OF III-NITRIDE HIGH ELECTRON MOBILITY TRANSISTOR

(71) Applicant: Infineon Technologies Austria AG, Villach (AT)

(72) Inventors: Iman Abdali Mashhadi, Ottawa (CA); Ahmad Mizannojehdehi, Stittsville (CA); Kai Ha, Kanata (CA); Vineet Unni, Kanata (CA); Maryam Abbasi, Kanata (CA); Thomas Macelwee, Nepean (CA)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 18/975,563

(22) Filed: Dec. 10, 2024

(65) Prior Publication Data

US 2026/0163563 A1 Jun. 11, 2026

(51) Int. Cl.

*H03K 17/0812* (2006.01)
*H10D 30/47* (2025.01)
*H10D 62/85* (2025.01)
*H10D 64/00* (2025.01)
*H03K 17/08* (2006.01)

(52) U.S. Cl.

CPC ..... *H03K 17/08122* (2013.01); *H10D 30/475* (2025.01); *H10D 62/8503* (2025.01); *H10D 64/112* (2025.01); *H03K 2017/0806* (2013.01)

(58) Field of Classification Search

CPC .............................................. H03K 17/08122
USPC ................................................ 327/108–112
See application file for complete search history.

(56) References Cited

U.S. PATENT DOCUMENTS

2012/0242376 A1* 9/2012 Ose .................... H03K 17/0828 327/109
2021/0217884 A1* 7/2021 Macelwee ............ H10D 30/015

* cited by examiner

*Primary Examiner* — Tomi Skibinski
(74) *Attorney, Agent, or Firm* — WORKMAN NYDEGGER

(57) ABSTRACT

The driving of a gate terminal of a High Electron Mobility Transistor (HEMT) such that the magnitude of the signal depends on temperature. Such transistors allow power to be transferred with much less power loss than conventional transistors, by using a two-dimensional electron gas (2DEG) to transfer current with high mobility. The reduced power loss is enabled by the high mobility of charge carriers in the 2DEG. Such a transistor has a channel semiconductor layer composed of a III-Nitride semiconductor. The channel semiconductor layer is immediately beneath a barrier semiconductor layer to form a heterojunction interface with the barrier semiconductor layer, which induces the 2DEG within the channel semiconductor layer. By applying lower temperatures to the gate terminal of the transistor than at higher temperatures, damage to the transistor is avoided.

20 Claims, 11 Drawing Sheets

TEMPERATURE DEPENDENT DRIVING OF GATE OF III-NITRIDE HIGH ELECTRON MOBILITY TRANSISTOR

BACKGROUND

Electronic circuits typically include transistors, which are devices that function as electronic switches that regulate or control current flow in portions of the circuit. A signal is applied to a gate terminal to turn the transistor on and off. A semiconductor channel region is disposed between the drain terminal and the source terminal. When the transistor is on, current flows through the semiconductor channel region between the source terminal and the drain terminal. When the transistor is off, lesser or no current flows through the semiconductor channel region between the source terminal and the drain terminal. The gate terminal is disposed over the semiconductor channel region between the source terminal and the drain terminal in such proximity that signals applied to the gate terminal affect whether the semiconductor channel region conducts current.

Silicon has traditionally been used to fabricate transistors. However, wider bandgap semiconductor material may be used to fabricate transistors that conduct higher power and operate at higher efficiency than silicon transistors. Silicon carbide (SiC), Aluminum Nitride (AlN) Zinc Oxide (ZnO), Gallium Arsenide (GaAs) and Gallium Nitride (GaN) are each examples of wide bandgap semiconductor materials that can be used in power electronics. One way to use such wider bandgap semiconductor materials is to form two layers of different semiconductor materials to therebetween form a heterojunction.

These two semiconductor materials may have sufficiently different bandgap profiles such that when brought together, the joined conductive band of the bandgap drops below the Fermi level just within the channel semiconductor layer. This means that electrons may freely flow within this region. This region is thin in depth and forms a plane parallel to the upper surface of the channel semiconductor layer. Thus, this region is called a "Two-Dimensional Electron Gas" (or "2DEG") (emphasizing "Two-Dimensional") to emphasize its planar form. Furthermore, this region is also referred to as a "Two-Dimensional Electron Gas" (emphasizing "Electron Gas") due to the high mobility of electrons in this region. Thus, the 2DEG is highly conductive. The 2DEG may form the channel region of a power semiconductor with relatively low resistance to allow passage of a large amount of current.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Embodiments described herein relate to the driving of a gate terminal of a High Electron Mobility Transistor (HEMT) such that the magnitude of the signal depends on temperature. HEMTs allow power to be transferred with much less power loss than conventional transistors. Such a HEMT transistor uses a two-dimensional electron gas (2DEG) to transfer current. The reduced power loss is enabled by the high mobility of charge carriers in the 2DEG.

The 2DEG is induced by a barrier semiconductor layer and a neighboring channel semiconductor layer. Each of the channel semiconductor layer and the barrier semiconductor layer is composed of a III-Nitride semiconductor, but with different compositions of Group III elements, such that a heterojunction interface is formed that induces the 2DEG within the channel semiconductor layer. As an example only, a Gallium Nitride (GaN) channel layer and an Aluminum Gallium Nitride ($Al_xGa_{1-x}N$) barrier layer will induce a 2DEG for some values of x. Finally, the gate terminal is proximate to the 2DEG such that the signals applied to the gate terminal control whether the 2DEG is continuous underneath the gate terminal.

Counterintuitively, for reasons explained in more detail hereinbelow, such a transistor may be physically damaged if the gate terminal is driven with the same magnitude of signal when the transistor is in a lower temperature environment (e.g., well below zero degrees Celsius) as compared to when the transistor is at higher temperatures (e.g., room temperature or at positive degrees Celsius). The principles described herein reduce the magnitude of the signal applied to the gate terminal when at lower temperatures compared to higher temperatures. Thus, the principles described herein increase the operating lifetime of such a transistor when the transistor sometimes operates in low temperature environments. Accordingly, the principles described herein also increase the variety of environments in which the transistor may operate for extended periods. For instance, the principles described herein may allow such transistors to operate in automobiles, aircraft or spacecraft, mobile devices, portable medical equipment, or any other environment in which temperatures may vary significantly and may reach low temperatures.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

Embodiments described herein relate to the driving of a gate terminal of a High Electron Mobility Transistor (HEMT) such that the magnitude of the signal depends on temperature. HEMTs allow power to be transferred with much less power loss than conventional transistors. Such a HEMT transistor uses a two-dimensional electron gas (2DEG) to transfer current. The reduced power loss is enabled by the high mobility of charge carriers in the 2DEG.

The 2DEG is induced by a barrier semiconductor layer and a neighboring channel semiconductor layer. Each of the channel semiconductor layer and the barrier semiconductor layer is composed of a III-Nitride semiconductor, but with different compositions of Group III elements, such that a heterojunction interface is formed that induces the 2DEG within the channel semiconductor layer. As an example only, a Gallium Nitride (GaN) channel layer and an Aluminum Gallium Nitride ($Al_xGa_{1-x}N$) barrier layer will induce a 2DEG for some values of x. Finally, the gate terminal is proximate to the 2DEG such that the signals applied to the gate terminal control whether the 2DEG is continuous underneath the gate terminal.

Counterintuitively, for reasons explained in more detail hereinbelow, such a transistor may be physically damaged if the gate terminal is driven with the same magnitude of signal when the transistor is in a lower temperature environment (e.g., well below zero degrees Celsius) as compared to when the transistor is at higher temperatures (e.g., room temperature or at positive degrees Celsius). The principles described herein reduce the magnitude of the signal applied to the gate terminal when at lower temperatures compared to higher temperatures. Thus, the principles described herein increase the operating lifetime of such a transistor when the transistor sometimes operates in low temperature environments. Accordingly, the principles described herein also increase the variety of environments in which the transistor may operate for extended periods. For instance, the principles described herein may allow such transistors to operate in automobiles, aircraft or spacecraft, mobile devices, portable medical equipment, or any other environment in which temperatures may vary significantly and may reach low temperatures.

First, the concept of High Electron Mobility Transistors or "HEMTs" will be described with respect to FIGS. 1 and 2. Thereafter, the principles related to the temperature-dependent driving of the gate terminal of such HEMTs, and the reason for doing such driving, will be explained with respect to subsequent drawings.

Figure 1:
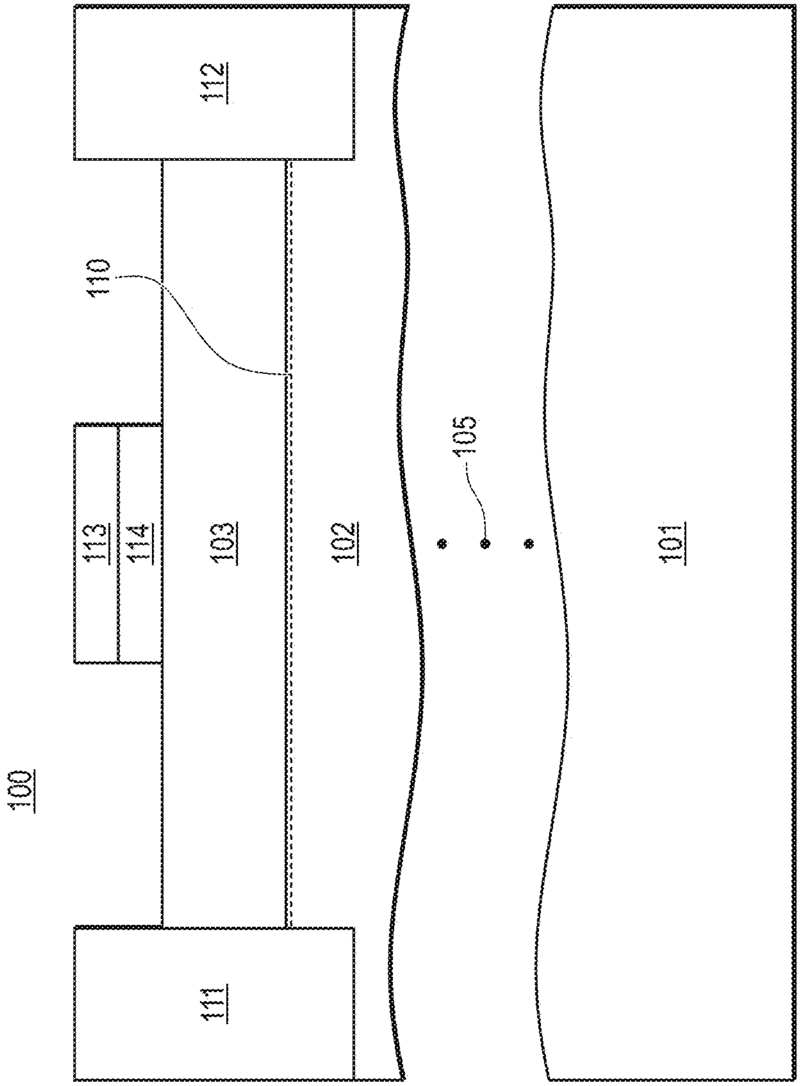
FIG. 1 is a simplified illustration of a transistor called a High Electron Mobility Transistor (HEMT) that may be used to pass high amounts of power.

FIG. 1 is an illustration of an embodiment of a transistor 100 in accordance with the principles described herein. The transistor 100 is a simplified diagram used to describe the general principle of transistors that use 2DEGs, which transistors are called "High Electron Mobility Transistors" or "HEMTs". A more specific example will be provided with respect to FIG. 2, which illustrates more concretely more details of a HEMT.

The transistor 100 may be formed by epitaxially growing an epitaxial stack on a substrate. In this description and in the claims, a direction of growth of this epitaxial stack will be referred to as a "vertical" direction. Consequently, terms describing relative vertical position (such as "beneath", "below", and "above" and so forth) are with respect to this vertical direction. For instance, if a second layer is epitaxially grown on the first layer, the second layer will be "above" the first layer, and the first layer will be "beneath" the second layer.

Returning to FIG. 1, the transistor 100 includes a semiconductor substrate 101 that forms a foundation on which further layers may be epitaxially grown to formulate part of a transistor structure. The semiconductor substrate 101 may be any semiconductor, including silicon. Layers epitaxially grown on top of the semiconductor substrate 101 will be referred to hereinafter as an "epitaxial stack".

The epitaxial stack includes a channel semiconductor layer 102 epitaxially grown using the semiconductor substrate 101 as a foundation. The channel semiconductor layer 102 may be comprised of any suitable III-Nitride semiconductor. As a more specific example, the channel semiconductor layer 102 may be composed of xN, where "x" is Aluminum (Al), Indium (In), Gallium (Ga) or another Group III element. If xN is a ternary alloy, x may be a composition of any two Group III elements including Al, In, Ga, or another Group III element. If xN is a quaternary alloy, x may be composed of a composition of any three Group III elements including Al, In, Ga, or another Group III element.

The ellipsis 105 represents that there may be any number of layers in the epitaxial stack between the semiconductor substrate 101 and the channel semiconductor layer 102. As an example only, strain relief layers may be formed between the semiconductor substrate and the channel semiconductor layer 102 to thereby improve the mechanical stability and electrical performance of the transistor 100. Nevertheless, the principles described herein are not limited to what (if any) layers are between the semiconductor substrate 101 and the channel semiconductor layer 102. Suffice it to say that the semiconductor substrate 101 is rigidly coupled to the channel semiconductor layer 102 to provide adequate support for the channel semiconductor layer 102 as well as the remainder of the epitaxial stack, in the sense that all epitaxial layers are rigidly coupled to a substrate on which they are grown.

A barrier semiconductor layer 103 is epitaxially grown on the channel semiconductor layer 102 such that the barrier semiconductor layer 103 is immediately above the channel semiconductor layer 102. The barrier semiconductor layer 103 may be comprised of any suitable semiconductor material. For instance, the barrier semiconductor layer 103 may also be composed of a III-Nitride semiconductor. As a more specific example, the barrier semiconductor layer 103 may be composed of xN, where x is Aluminum (Al), Indium (In) or Gallium (Ga). If xN is a ternary or quaternary alloy, x will be composed of a composition comprising any two or more of Al, In and Ga.

However, the compositions of the channel semiconductor layer 102 and the barrier semiconductor layer 103 are chosen such that the differences in the bandgap profiles cause a heterojunction interface to form therebetween. In such a heterojunction interface, the conduction band edge of the channel semiconductor layer 102 is pulled downwards near the heterojunction interface, thus creating an energy potential well that dips below the Fermi level vertically just within the channel semiconductor layer 102. Because the energy potential well is below the Fermi level, free electrons exist in this well, forming a highly conductive two-dimensional electron gas ("2DEG") 110 to form within the channel semiconductor layer 102. The 2DEG 110 is represented by the horizontal dashed line in FIG. 1.

The vertical thickness of the region in which such free electrons exist corresponds to the short vertical span of the well that dips below the Fermi level. Thus, the 2DEG is vertically thin. However, the region is planar in the horizontal plane. Thus, this region is called a "Two-Dimensional" Electron Gas to emphasize its planar form. The reference to "Electron Gas" in the term is to emphasize that the electrons in the 2DEG have high mobility. The 2DEG is also referred to as a "sea of electrons" also emphasizing the mobility of the electrons in the 2DEG. The 2DEG may form the channel region of a power semiconductor to allow passage of high currents with relatively low resistance due to the high mobility of electrons. Thus, 2DEGs are indispensable in high-frequency and high-power electronics, with applications in devices such as HEMTs.

A source contact 111 is in conductive contact with the 2DEG 110, which means that electrons may flow freely between the source contact 111 and the 2DEG 110 (see leftmost portion of the 2DEG 110 as shown in FIG. 1). This may be because the source contact 111 and the 2DEG 110 are in direct contact (as shown in FIG. 1), or perhaps they are not in direct contact, but close enough that the electrons may still flow between the source contact 111 and the 2DEG 110. Likewise, a drain contact 112 is also in conductive contact with the 2DEG 110 (see rightmost portion of the 2DEG 110 as shown in FIG. 1). If the 2DEG 110 is continuous between the source contact 111 and the drain contact 112, the 2DEG 110 serves as a channel through which electrons may flow between the source contact 111 and the drain contact 112.

A gate terminal 113 is proximate the 2DEG 110 such that signals applied to the gate terminal 113 control whether the 2DEG 110 is continuous between the source contact 111 and the drain contact 112. If the transistor 100 is a depletion mode transistor, the transistor 100 is on when no signal is applied to the gate terminal 113 and off when a sufficient negative signal is applied to the gate terminal 113. However, a p-doped layer 114 is situated between the gate terminal 113 and the barrier semiconductor layer 103, causing the transistor 100 to be an enhancement mode transistor, in which the transistor 100 is off when no signal is applied to the gate terminal 113, and on when a sufficient positive signal is applied to the gate terminal 113. The p-doped layer 114 may be a p-doped III-Nitride semiconductor. For process simplicity, the p-doped layer 114 may be a p-doped version of the same III-Nitride semiconductor that composes the channel semiconductor layer 102 or the barrier semiconductor layer 103.

The gate terminal 113 and the p-doped layer 114 may be of materials such that the interface is a Schottky contact—which may be the case when the gate terminal 113 is metal. In this case, the gate terminal 113 is said to be a Schottky gate contact, and the signal applied to the gate terminal 113 is a voltage signal. With a Schottky gate contact, the transistor 100 is on when a sufficient positive voltage is applied to the gate terminal 113, and off when no voltage is applied to the gate terminal. On the other hand, the gate terminal 113 and the p-doped layer 114 may be of materials such that the interface is an ohmic contact. In this case, the gate terminal 113 is said to be an ohmic gate contact, and the signal applied to the gate terminal 113 is a current signal. With an ohmic gate contact, the transistor 100 is on when a sufficient positive current is applied to the gate terminal 113, and off when no current is applied to the gate terminal, similar to a bipolar junction transistor.

Figure 2:
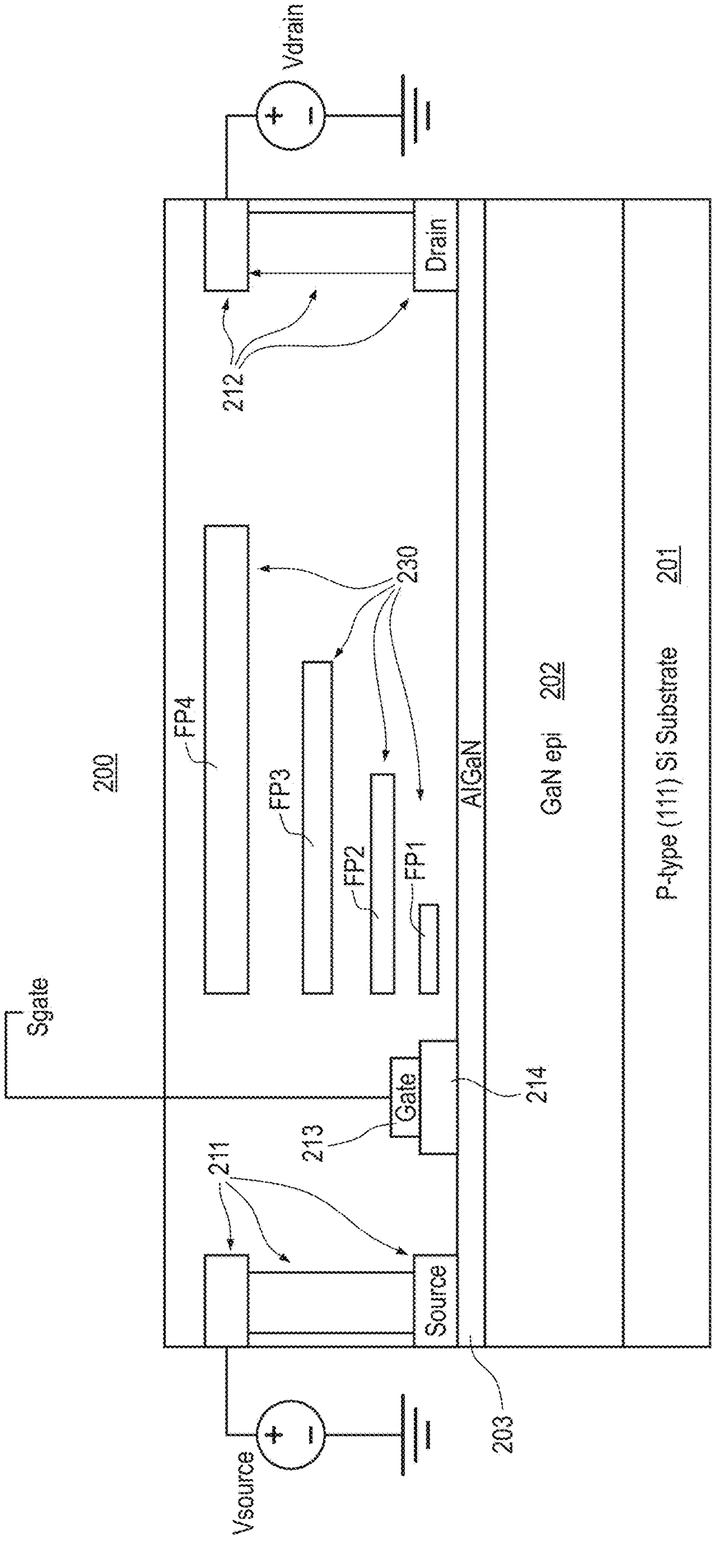
FIG. 2 illustrates a transistor that is a specific example of the transistor of FIG. 1.

FIG. 2 illustrates a transistor 200 that is a specific example of the transistor 100 of FIG. 1. The P-type (111) substrate 201 is an example of the semiconductor substrate 101 of FIG. 1, the GaN epitaxial layer 202 is an example of the channel semiconductor layer 102 of FIG. 1, and the AlGaN layer 203 is an example of the barrier semiconductor layer 103 of FIG. 1. Moreover, the source contact structure 211 (having a voltage Vsource applied thereto) is an example of the source contact 111 of FIG. 1, the drain contact structure 212 (having a voltage Vdrain applied thereto) is an example of the drain contact 112 of FIG. 1, the gate terminal 213 (having a signal Sgate applied thereto) is an example of the gate terminal 113 of FIG. 1, and the p-doped layer 214 is an example of the p-doped layer 114 of FIG. 1.

The p-doped layer 214 is situated between the gate terminal 213 and the AlGaN layer 203. In one example, the p-doped layer 214 is p-doped GaN, but the p-doped layer 214 may be any p-doped III-Nitride semiconductor. If the gate terminal 213 and the p-doped layer 214 form a Schottky contact—the signal Sgate applied to the gate terminal 213 is said to be a voltage signal called Vgate or "Vgs". Here, the voltage used to turn the transistor on will be referred to as the "on voltage". On the other hand, if the gate terminal 213 and the p-doped layer 214 form an ohmic contact, the signal Sgate applied to the gate terminal 213 is said to be a current signal called Igate or "Igs". Here, the current used to turn the transistor on will be referred to as the "on current". A field plate structure 230 is also shown (which includes field plates FP1, FP2, FP3 and FP4), which allows for management of the electrical field profile in the 2DEG.

Figure 3:
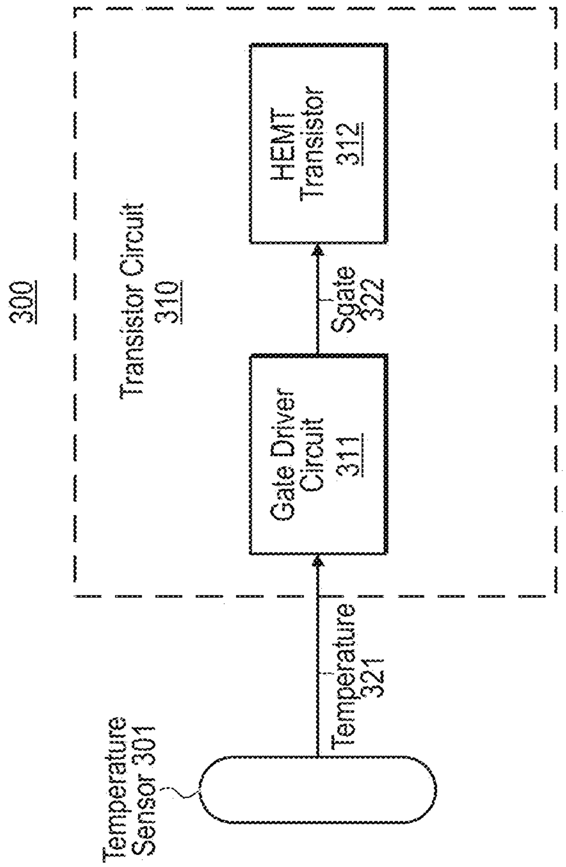
FIG. 3 illustrates an environment in which the principles described herein may be practiced, which includes a temperature senser whose temperature signal controls a gate driver circuit that drives the gate terminal of a HEMT transistor, such as the HEMT transistor of FIG. 1 or FIG. 2.

FIG. 3 illustrates an environment 300 in which the principles described herein may be practiced. The environment 300 includes a temperature sensor 301 and a transistor circuit 310. The transistor circuit 310 includes a gate driver circuit 311 and a HEMT transistor 312. The HEMT transistor 312 may be any transistor that uses a 2DEG where the 2DEG is induced by a channel semiconductor layer and a barrier semiconductor layer, each composed of III-Nitride semiconductors. As an example, the HEMT transistor 312 may be the transistor 100 of FIG. 1, or the transistor 200 of FIG. 2.

The temperature sensor 301 is configured to generate a temperature signal 321 that represents a temperature of the environment 300 of the transistor circuit 310. The temperature sensor 301 is further configured to output the temperature signal 321 to the gate driver circuit 311. The gate driver circuit 311 is configured to generate a temperature-dependent gate drive signal Sgate 322 to drive a gate terminal of the HEMT transistor 312 where the magnitude of the signal Sgate 322 depends on the temperature of the environment 300. As an example, the signal Sgate 322 may be as described above for the signal Sgate of FIG. 2. Again, the signal Sgate 322 may be a voltage signal (called "Vgate" or "Vgs") in the case of the HEMT transistor 312 having a Schottky gate contact, or a current signal (called "Igate" or "Igs") in the case of the HEMT transistor 312 having an ohmic gate contact.

Figure 4:
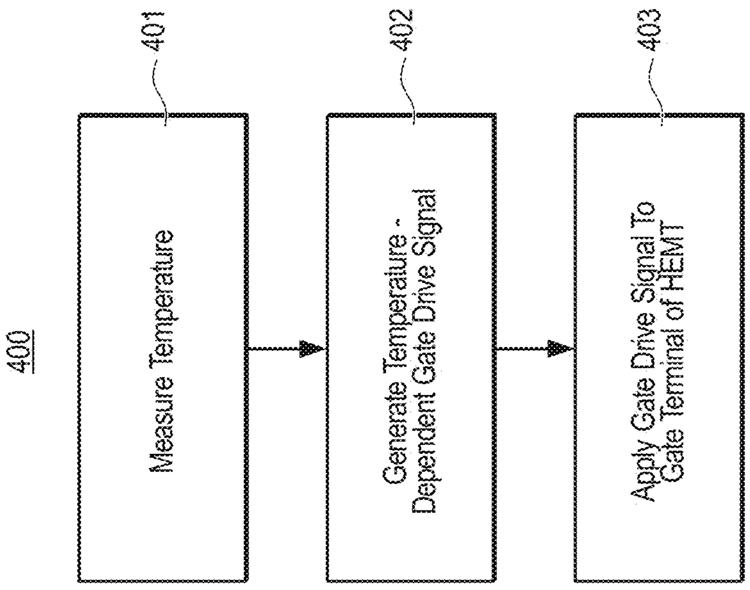
FIG. 4 illustrates a flowchart of a method for generating a signal to drive a gate terminal of a transistor where the magnitude of the signal depends on temperature, in accordance with the principles described herein.

FIG. 4 illustrates a flowchart of a method 400 for generating a signal to drive a gate terminal of a transistor where the magnitude of the signal depends on temperature, in accordance with the principles described herein. As the method 400 may be performed continuously in the environment 300 of FIG. 3, the method 400 of FIG. 4 will now be described with reference to the environment 300 of FIG. 3.

The method 400 includes measuring a temperature of an environment in which the transistor operates (act 401). Referring to FIG. 3 as an example, the temperature sensor 301 continuously measures the temperature of the environment 300 in which the HEMT transistor 312 operates. The method 400 further includes generating a temperature-dependent gate drive signal that depends on the measured temperature (act 402). Referring to FIG. 3, the gate driver circuit 311 generates the signal Sgate 322 that depends on the temperature signal 321. The temperature-dependent drive signal 322 is then applied to the gate terminal of the transistor (act 403). Referring to FIG. 3, the gate driver circuit applies the signal Sgate 322 to the HEMT transistor 312. As an example, referring to FIG. 2, the signal Sgate may be applied to the gate terminal 213 of the transistor 200.

Figure 5:
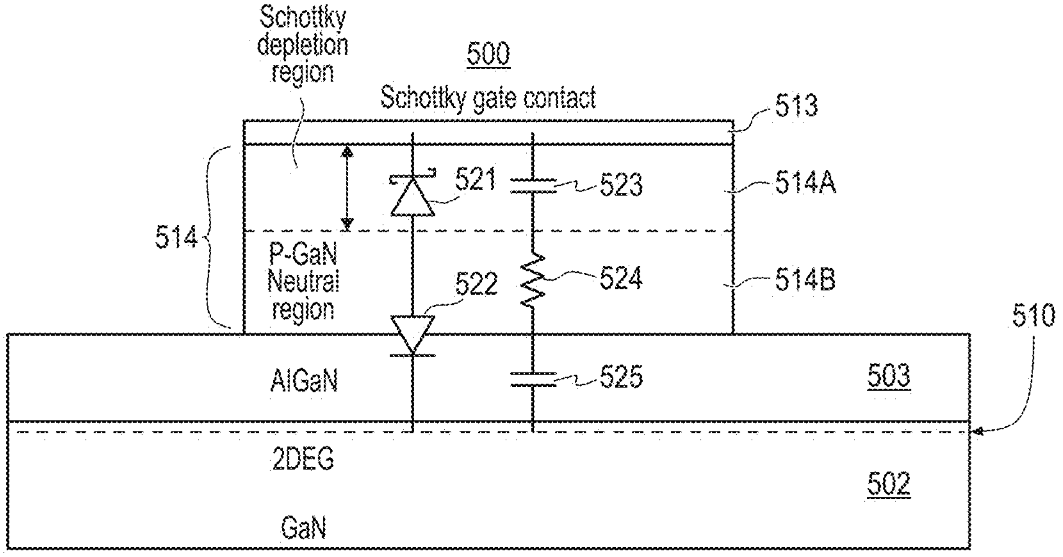
FIG. 5 illustrates a cross section of a gate portion of a HEMT transistor having a Schottky gate contact.
Figure 6:
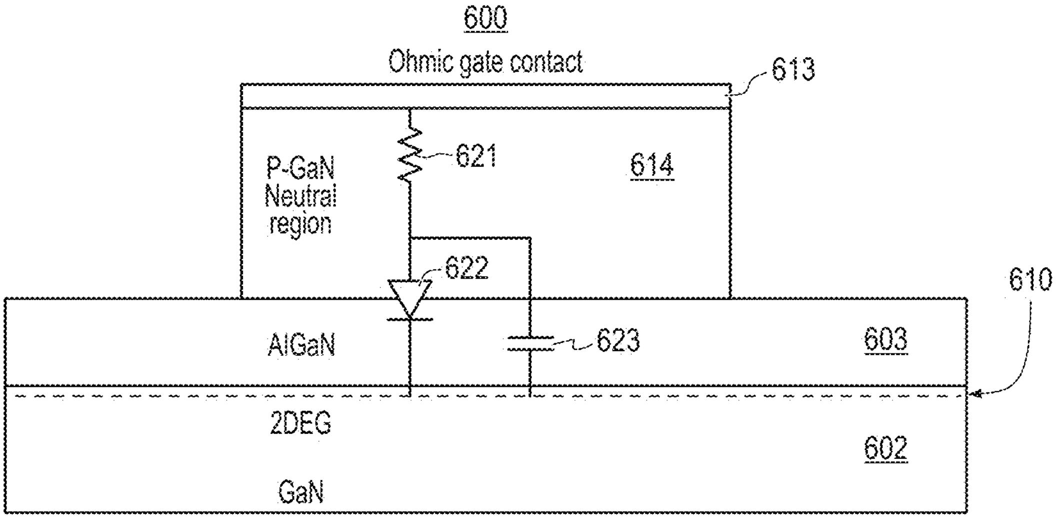
FIG. 6 illustrates a cross section of a gate portion of a HEMT transistor having an ohmic gate contact.

As previously mentioned, HEMT operation at low temperature can cause damage to the HEMT. More regarding the cause and nature of this damage will now be described. However, the nature of the damage is different for Schottky gate contacts and ohmic gate contacts. Accordingly, FIG. 5 illustrates a cross section of a gate portion 500 of a HEMT transistor having a Schottky gate contact, which will be used to describe the damage that can be caused over time by low temperature operation of the transistor having the Schottky gate contact. On the other hand, FIG. 6 illustrates a cross section of a gate portion 600 of a HEMT transistor having an ohmic gate contact, which will be used to describe the damage that can be caused over time by low temperature operation of the transistor having the ohmic gate contact.

In FIG. 5, the gate portion 500 includes a GaN channel layer 502, an AlGaN barrier layer 503 (and an induced 2DEG 510), a gate terminal 513, and a p-doped layer 514. The GaN channel layer 502 is an example of the channel semiconductor layer 102 of FIG. 1, and the GaN epitaxial layer 202 of FIG. 2. The AlGaN barrier layer 503 is an example of the barrier semiconductor layer 103 of FIG. 1, and the AlGaN layer 203 of FIG. 2. The 2DEG 510 is an example of the 2DEG 110 of FIG. 1, and the 2DEG 210 of FIG. 2. The gate terminal 513 is an example of the gate terminal 113 of FIG. 1, and the gate terminal 213 of FIG. 2. The p-doped layer 514 is an example of the p-doped layer 114 of FIG. 1, and the p-doped layer 214 of FIG. 2.

In the case of a Schottky gate contact, the p-doped layer 514 includes a Schottky depletion region 514A and a neutral region 514B. The electrical behavior characteristics of the Schottky gate contact can be modelled by the following in series from the gate terminal 513 to the 2DEG 510: a reverse-biased Schottky diode 521 (induced by the Schottky depletion region 514A) and a forward-biased diode 522 (at the interface between the p-doped layer 514 and the AlGaN barrier layer 503). The electrical behavior characteristics of the Schottky gate contact can also be modelled by the following in series from the gate terminal 513 to the 2DEG 510: a capacitor 523 (being the parasitic capacitance of the Schottky depletion region 514A), a resistor 524 (being the resistance of the P-GaN neutral region 514B) and a capacitor 525 (being the parasitic capacitance of the AlGaN barrier layer 503).

Proper operation of the gate portion 500 relies on the reverse-biased Schottky diode 521 helping the gate terminal maintain a voltage with ideally no current flow from the gate terminal 513 to the 2DEG 510. For a given gate voltage at the gate terminal 513, the time to failure of the Schottky diode 521 depends strongly on the temperature. That is, as temperatures decrease, the time to failure of the Schottky diode 521 shortens for a given on voltage applied at the gate terminal 513. Accordingly, as temperature decreases, the time to failure of the entire transistor shortens for a given on voltage. Through internal experimentation, it was found that this is due to actual structural damage to the transistor caused by an increase in the mean free path, causing more 2DEG electrons to more easily cross towards the Schottky depletion region, which electrons are accelerated due to the vertical electric field, which cause high energy impact ionization (and corresponding structural damage) at or near the Schottky depletion region 514A. Additional damage may be caused in the dielectric near the gate corner also due to accelerated 2DEG electrons.

Damage to a transistor can also be caused when the gate contact is an ohmic gate contact. FIG. 6 illustrates a cross section of a gate portion 600 of a HEMT transistor having an ohmic gate contact, In FIG. 6, the gate portion 600 includes a GaN channel layer 602, an AlGaN barrier layer 603 (and an induced 2DEG 610), a gate terminal 613, and a p-doped layer 614. Again, the GaN channel layer 602 is an example of the channel semiconductor layer 102 of FIG. 1, and the GaN epitaxial layer 202 of FIG. 2. The AlGaN barrier layer 603 is an example of the barrier semiconductor layer 103 of FIG. 1, and the AlGaN layer 203 of FIG. 2. The 2DEG 610 is an example of the 2DEG 110 of FIG. 1, and the 2DEG 210 of FIG. 2. The gate terminal 613 is an example of the gate terminal 113 of FIG. 1, and the gate terminal 213 of FIG. 2. The p-doped layer 614 is an example of the p-doped layer 114 of FIG. 1, and the p-doped layer 214 of FIG. 2.

In the case of an ohmic gate contact, the p-doped layer 614 acts as a resistor which is modeled by the resistor 621. The interface between the p-doped layer 614 and the AlGaN barrier layer 603 can be modelled as a forward-biased diode 622. Furthermore, the AlGaN barrier layer 603 has an implicit capacitance 623. Thus, the electrical behavior of the ohmic gate contact can be modelled by the following in series from the gate terminal 613 to the 2DEG 610: a resistor 621 followed by a parallel combination of a forward-biased diode 622 and a capacitor 623. Although the mechanism and cause of low temperature failure are different for Schottky gate contacts and ohmic gate contacts, low temperature operation of the ohmic gate contact can cause failure of the transistor due to parametric shift—such as reductions in the threshold current required to turn on the transistor.

To avoid this damage at low temperatures, the principles described herein significantly increase the operating lifetime of the transistor at low temperatures by applying a lower magnitude of gate drive signal to turn and keep the transistor on when the transistor is operating at low temperatures as compared to that which is applied when the transistor is operating at high temperatures. Normally, the application of a lower gate drive signal Sgate might be considered undesirable because lower drive signals are known to result in a lower saturation current Idsat, which is undesirable for power transistors. However, for a given magnitude of gate drive signal, internal experiments have also revealed that lower temperatures may also bring higher saturation currents Idsat.

Accordingly, the principles described herein involve lowering the magnitude of the gate drive signal Sgate to a sufficient degree to avoid damage to the transistor at low temperatures, but not so far that the saturation current falls too far below optimum. Based on experimentation, for a given operational temperature range (of minus 70 degrees to positive 30 degrees Celsius), a suitable balance in the case of GaN based transistor is such that the magnitude of the signal Sgate at the lowest temperature of the temperature range is between 60 percent and 90 percent of the magnitude of the signal at a highest temperature of the temperature range. However, the balance may differ based on whether the gate contact is Schottky or ohmic, the materials involved in the various layers, and the process technology used to create the transistor.

Figure 7:
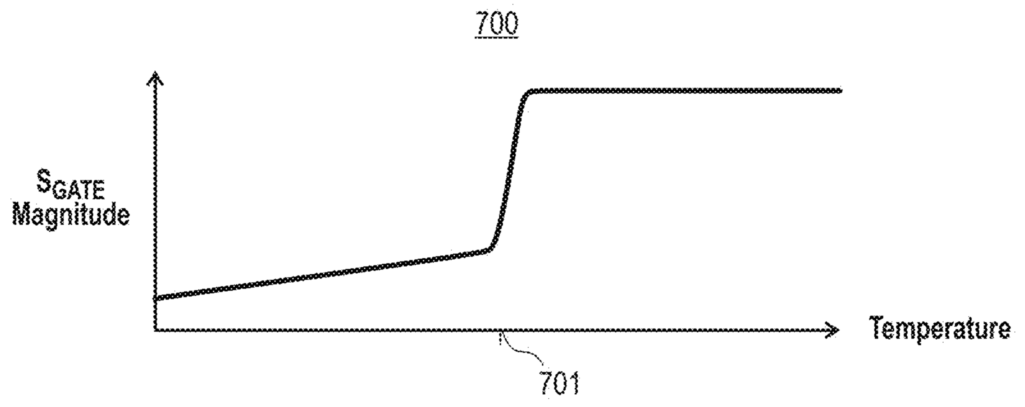
FIG. 7 illustrates a graph showing an example of a discrete relationship between the magnitude of the gate drive signal with temperature in which there is a threshold voltage.

The magnitude of the gate drive signal Sgate may be a discrete function such that there is a threshold temperature above which the magnitude of the gate drive signal Sgate is much different than it would be below that threshold temperature. FIG. 7 is a graph 700 showing an example of a relationship between the magnitude of the gate drive signal Sgate with temperature in which there is a threshold voltage 701. The operational temperature range of the transistor is shown on the x-axis, and the magnitude of the gate drive signal is shown on the y-axis. As an example only, if the transistor operates normally at a gate drive voltage of 7 volts above the threshold voltage 701, the transistor may operate at a reduced gate drive voltage of 4.5 to 6 volts below the threshold voltage 701.

Figure 8:
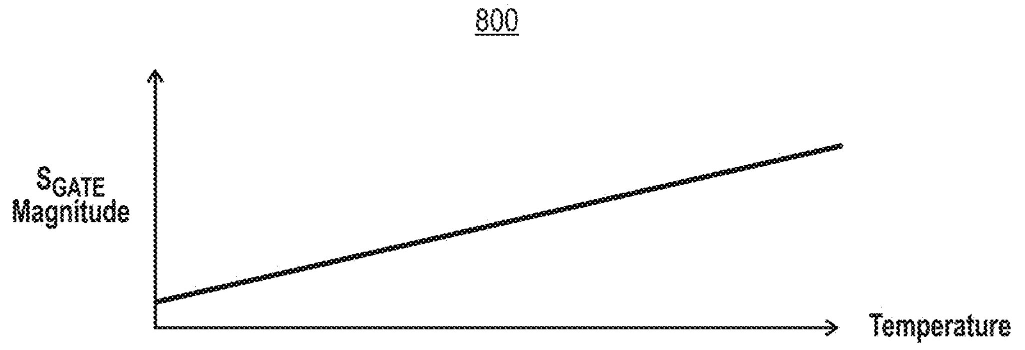
FIG. 8 illustrates a graph showing an example of a continuous linear relationship between the magnitude of the gate drive signal and the temperature.
Figure 9:
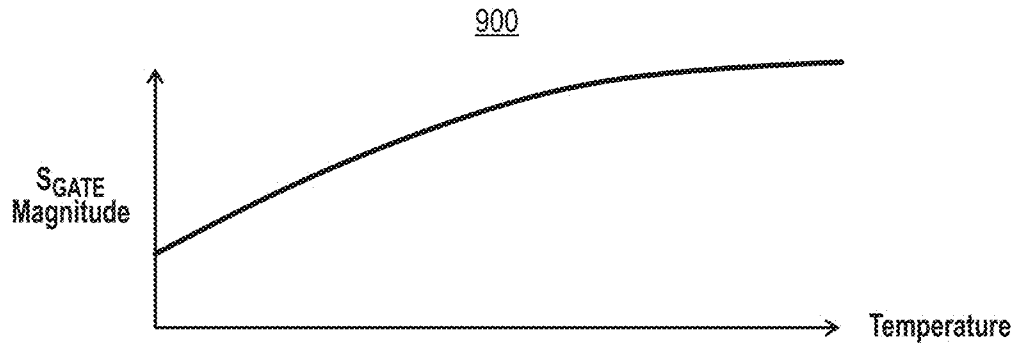
FIG. 9 illustrates a graph showing an example of a continuous non-linear relationship between the magnitude of the gate drive signal and the temperature.

However, the principles described herein are not limited to the precise dependence between the temperature and the magnitude of the gate drive signal. The gate drive signal may have a magnitude that varies more continuously with temperature changes. There is an infinite variety of such continuous functions, but FIG. 8 illustrates a graph 800 in which the relationship is more linear across the operating temperature range, and FIG. 9 illustrates a graph 900 in which the relationship is decreases with steeper slope as temperature declines. However, even the most simple functional relationship of FIG. 7 may result in the operating lifetime of a transistor at low temperatures being increased by one or more orders of magnitude.

The principles described herein are not limited in any way to the precise circuitry used to sense the temperature, or generate a gate drive signal that varies with temperature. The variety of such circuits that could be used to perform the described functions are practically limitless. Nevertheless, several specific example circuits will now be described with respect to FIG. 10 and subsequent figures.

Figure 10:
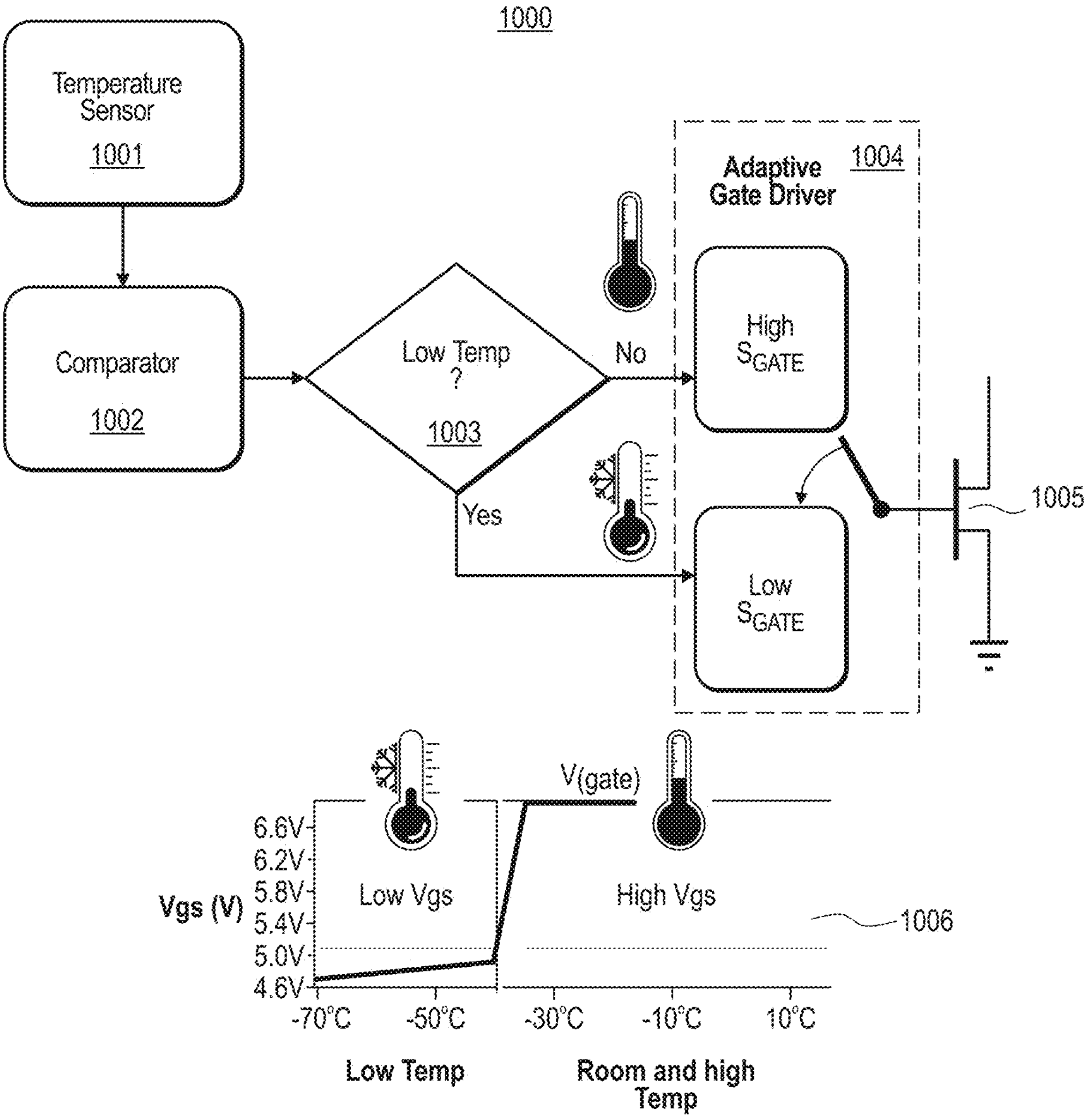
FIG. 10 illustrates an operation in which the gate drive signal is a discrete signal that is higher if the temperature is above a threshold, and lower if the temperature is below a threshold.

FIG. 10 illustrates an operating environment 1000 in which the gate drive signal is a discrete signal that is higher if the temperature is above a threshold, and lower if the temperature is below a threshold. The operation includes a temperature sensor 1001 that measures temperature, a comparator 1002 that compares the temperature to a threshold. Then, if a temperature is detected below that threshold temperature ("Yes" in decision block 1003), an adaptive gate driver 1004 applies a lower gate drive signal Sgate to the HEMT transistor 1005. Otherwise, if a temperature is detected above that threshold voltage ("No" in decision block 1003), the adaptive gate driver 1004 applies a higher gate drive signal Sgate to the HEMT transistor 1005. Thus, the operating environment 1000 may result in the discrete temperature dependence of the gate drive signal that is illustrated in FIG. 7, as also illustrated by the graph 1006.

Figure 11A:
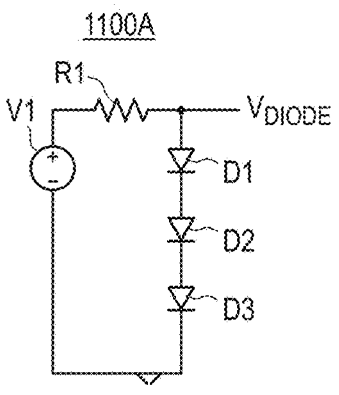
FIG. 11A illustrates a circuit that represents a first circuit embodiment of a temperature sensor.
Figure 11B:
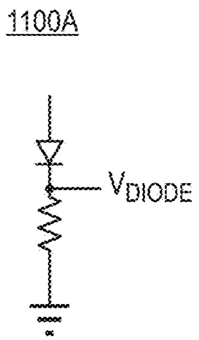
FIG. 11B illustrates a circuit that represents a second circuit embodiment of a temperature sensor.
Figure 11C:
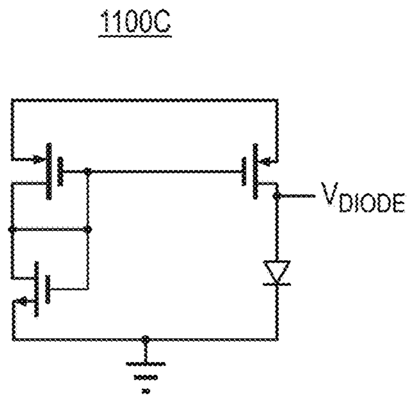
FIG. 11C illustrates a circuit that represents a third circuit embodiment of a temperature sensor.
Figure 12:
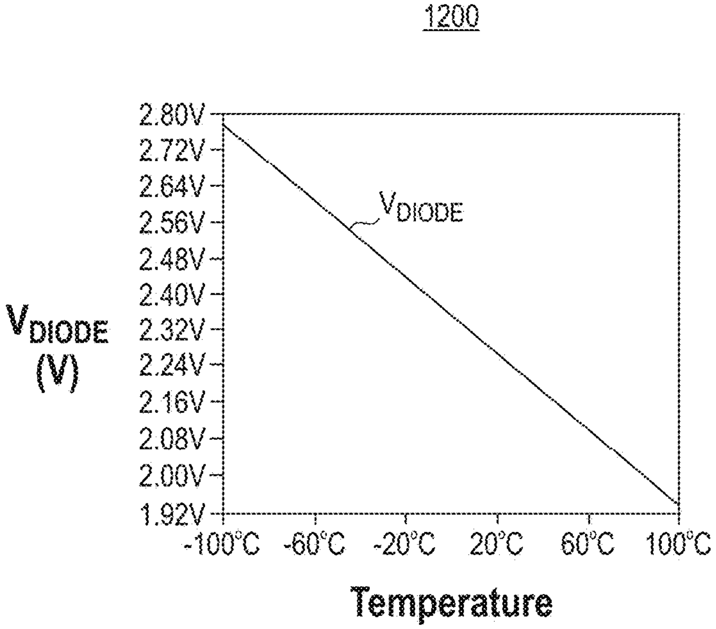
FIG. 12 illustrates a graph of an example relationship between the analog temperature signal $V_{DIODE}$ and temperature.

FIG. 11A through 11C illustrates three different circuit embodiments of a temperature sensor which are each examples of the temperature sensor 301 of FIG. 3, or the temperature sensor 1001 of FIG. 10. FIG. 11A illustrates a circuit 1100A in which there is a voltage source providing a fixed voltage V1. A resistor having resistance R1 is provided between the voltage V1 and the output node providing voltage $V_{DIODE}$. Between the voltage $V_{DIODE}$ and ground are three forward-biased diodes D1 through D3. When the circuit 1100A is implemented in silicon, the forward-biased resistance of each diode decreases linearly with temperature. Accordingly, through voltage division, the output voltage $V_{DIODE}$ also decreases linearly with temperature. FIG. 12 illustrates a graph 1200 of a relationship between the voltage $V_{DIODE}$ and temperature when using the circuit 1100A of FIG. 11A. Thus, the voltage $V_{DIODE}$ is an example of the temperature signal 321 of FIG. 3 where the temperature signal is an analog signal that varies with temperature.

FIG. 11B illustrates another circuit 1100B in which there is a forward-biased diode and a resistor in series between a fixed positive voltage source and ground, where the output voltage $V_{DIODE}$ is taken from between the diode and the resistor. Thus, the circuit 1100B is a voltage divider that depends on the resistance of the forward-biased diode. In silicon, the resistance of the forward-biased diode decreases with temperature, and thus in this case the output voltage $V_{DIODE}$ would increase with temperature, which is different than shown in FIG. 12.

FIG. 11C illustrates another circuit 1100C in which a current mirror is used to force a particular current through the rightward transistor, resulting in a voltage $V_{DIODE}$ that does have the characteristics shown in FIG. 12, even if implemented using GaN or the same materials used to formulate the HEMT transistor. Thus, the circuit 1100C may be formulated monolithically in the same chip as the HEMT transistor. The circuit 1100C is suitable for ohmic gate contacts.

Figure 13A:
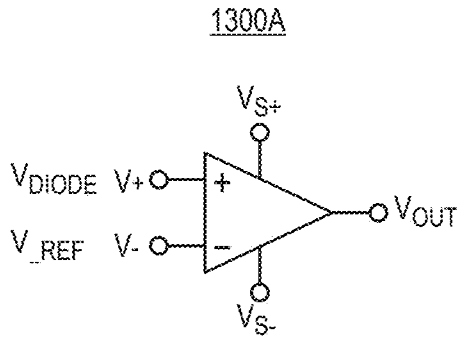
FIG. 13A illustrates a circuit that represents an example of the comparator of FIG. 10 which uses an operational amplifier to compare the analog temperature signal to a reference voltage.
Figure 13B:
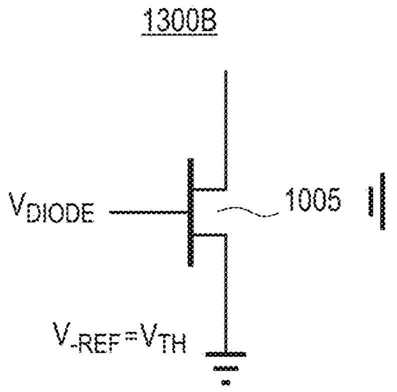
FIG. 13B illustrates a circuit that represents another example of the comparator of FIG. 10, in which the threshold voltage of a transistor may be taken as the reference voltage.
Figure 14:
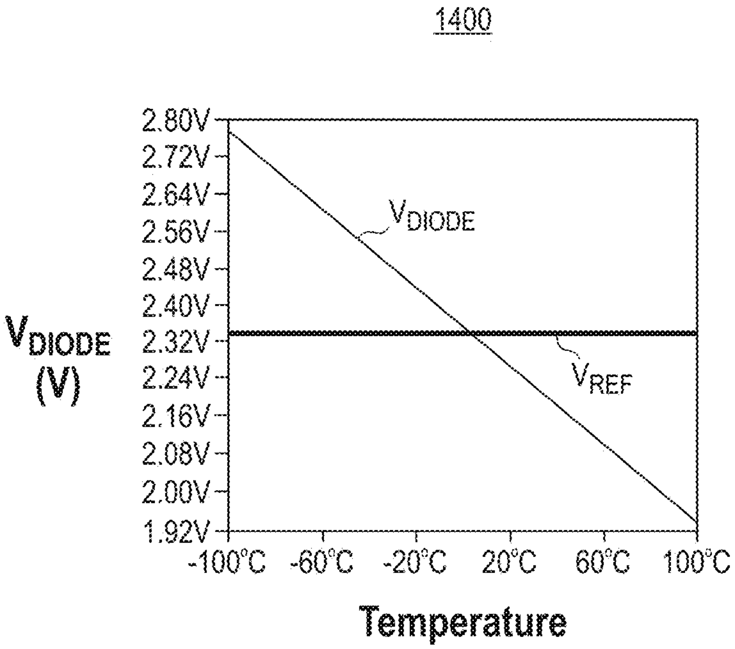
FIG. 14 illustrates an example of the relationship between the analog temperature signal $V_{DIODE}$ and the reference voltage.

FIG. 13A illustrates a circuit 1300A that represents an example of the comparator 1002 of FIG. 10, which uses an operational amplifier to compare the analog temperature signal $V_{DIODE}$ to a reference voltage V_REF, which will output a high signal if $V_{DIODE}$ is above the reference voltage V_REF and a low signal if $V_{DIODE}$ is below the reference voltage V_REF. FIG. 13B illustrates a circuit 1300B that represents another example of the comparator 1002 of FIG. 10. Here, the threshold voltage of a transistor may be taken as the reference voltage V_REF. If the voltage $V_{DIODE}$ is above the threshold voltage (which means the temperature is lower), the transistor is turned on pulling the output of the circuit 1300B high. On the other hand, if the voltage $V_{DIODE}$ is below the threshold voltage (which means the temperature is high), the transistor is turned on pulling the output of the circuit 1300B low. FIG. 14 illustrates a graph 1400 of an example of the relationship between the analog temperature signal $V_{DIODE}$ and the reference voltage V_REF. In this case, the comparator would output a high signal (indicating a low temperature detection) when the voltage $V_{DIODE}$ is greater than V_REF, and would output a low signal (indicating absence of a low temperature) when the voltage $V_{DIODE}$ is lower than V_REF. By changing V_REF, the threshold temperature may also be altered.

Figure 15A:
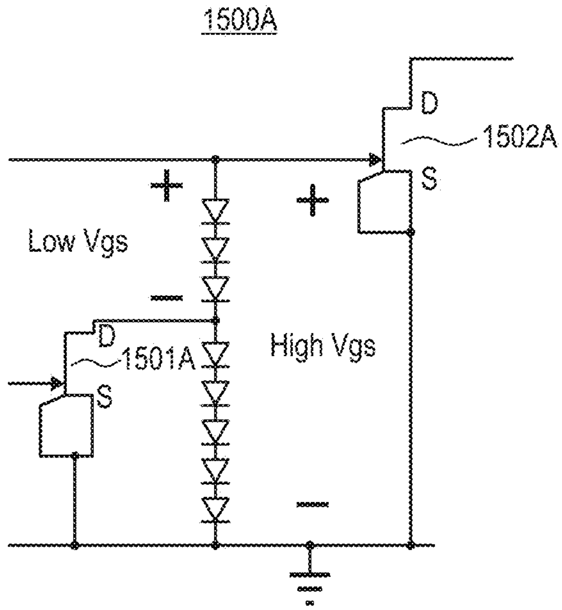
FIG. 15A illustrates a circuit that represents a first example of the adaptive gate driver circuit of FIG. 10.

FIG. 15A illustrates a circuit 1500A that represents an example of the adaptive gate driver 1004 of FIG. 10. Here, the gate of the transistor 1501A is driven by the output of the comparator such that when a low temperature is detected, the transistor 1501A is closed resulting in a low voltage being applied to the gate of the transistor 1502A. This voltage is low since the applied voltage is just the forward-biased voltage drop through only three diodes. On the other hand, when a low temperature is not detected, the transistor 1501A is open resulting in a high voltage being applied to the gate of the transistor 1502A, since now the voltage applied is equal to the voltage across all seven diodes. If the transistor 1502A has an ohmic contact, the implicit resistance in the transistor 1502A will cause the high and low gate voltages to results in high and low currents, respectively, being applied to the gate of the transistor 1502A.

Figure 15B:
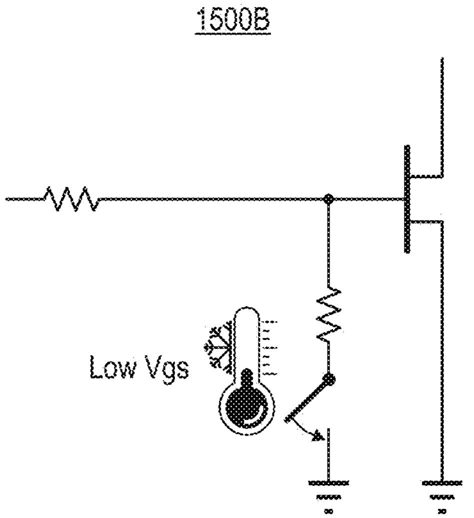
FIG. 15B illustrates a circuit that represents a second example of the adaptive gate driver circuit of FIG. 10.
Figure 15C:
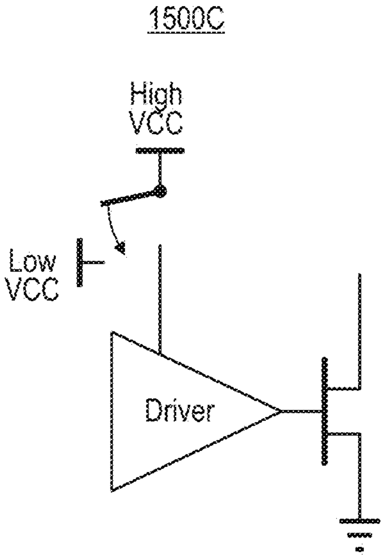
FIG. 15C illustrates a circuit that represents a second example of the adaptive gate driver circuit of FIG. 10.

FIG. 15B illustrates a circuit 1500B that represents another example of the adaptive gate driver 1004 of FIG. 10. Here, the switch is closed when a low temperature is detected drawing down the voltage applied to the gate of the transistor. The switch is open when a low temperature is not detected allowing the full high voltage to be applied to the gate of the transistor. FIG. 15C is another circuit 1500C that controls the voltage applied to the gate by controlling the high voltage VCC applied to the gate driver itself.

Figure 16A:
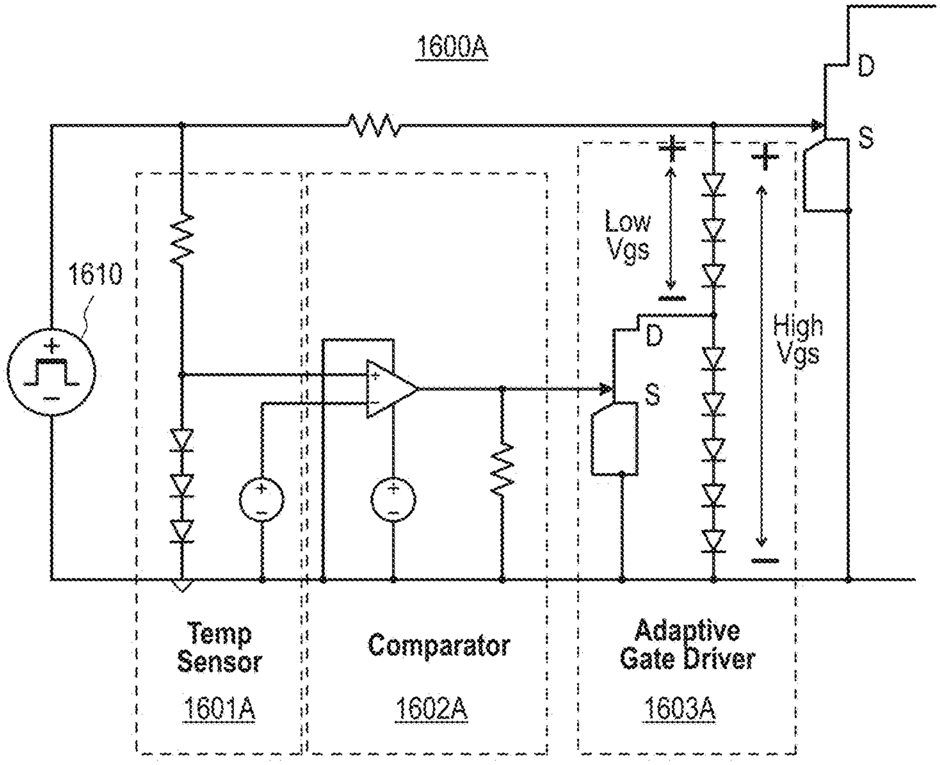
FIG. 16A illustrates a circuit that represents a first example of an implementation suitable for driving a Schottky gate contact of a HEMT transistor.
Figure 16B:
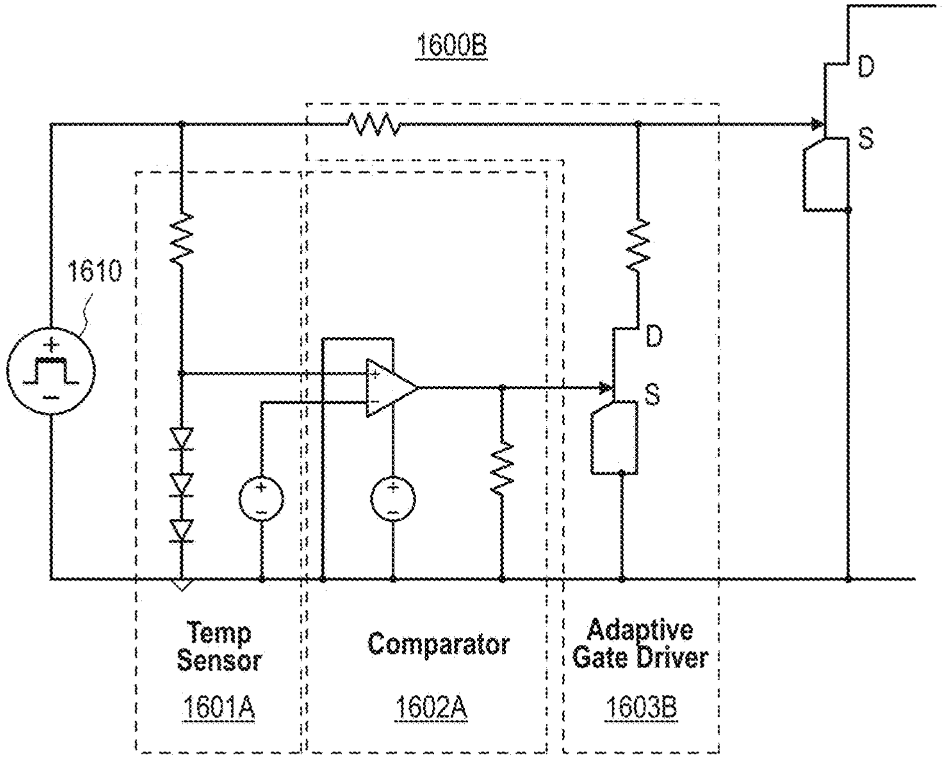
FIG. 16B illustrates a circuit that represents a second example of an implementation suitable for driving a Schottky gate contact of a HEMT transistor.

FIG. 16A is a circuit 1600A representing an implementation of the entire operating environment 1000 of FIG. 10, which is suitable for driving a HEMT with a Schottky contact. Here, there is a temperature sensor 1601A which is similar to the circuit 1100A of FIG. 11A, a comparator 1602A which is similar to the circuit 1300A of FIG. 13A, and an adaptive gate driver 1603A which is similar to the circuit 1500A of FIG. 15A. The use of the circuit 1500A prevents gate overshoot since the voltage is clamped to the sum of the forward-biased diodes coupling the gate to ground. FIG. 16B is an implementation of the operating environment 1000 of FIG. 10, which is similar to the circuit 1600A of FIG. 16A, except that the adaptive gate driver 1603B is implemented by the circuit 1500B of FIG. 15B.

Figure 17A:
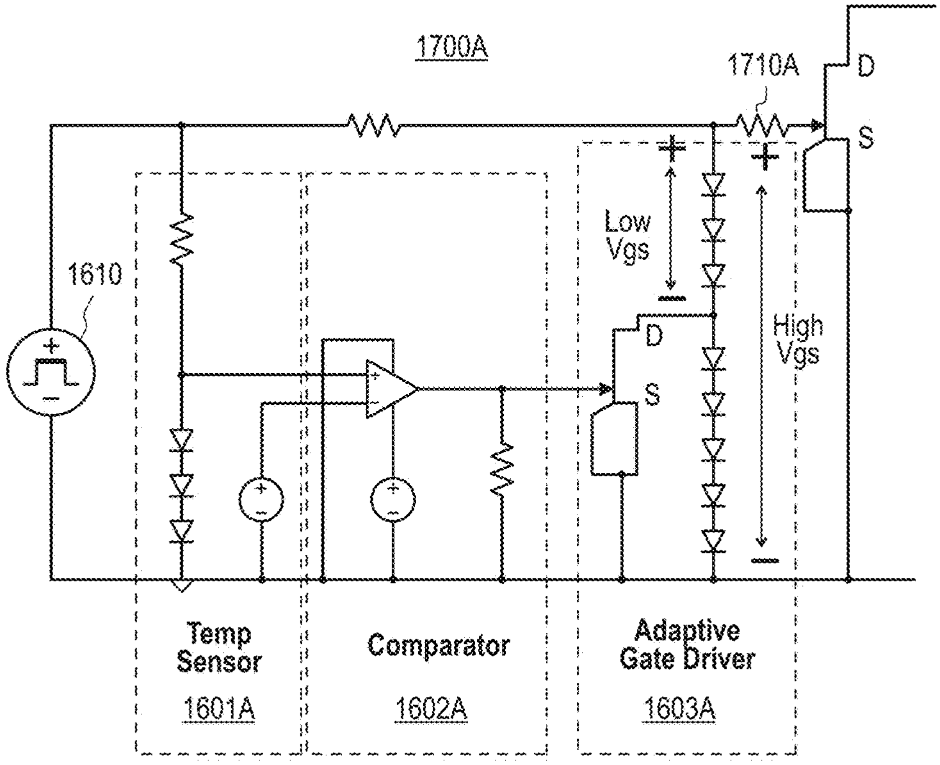
FIG. 17A illustrates a circuit that represents a first example of an implementation suitable for driving an ohmic gate contact of a HEMT transistor.
Figure 17B:
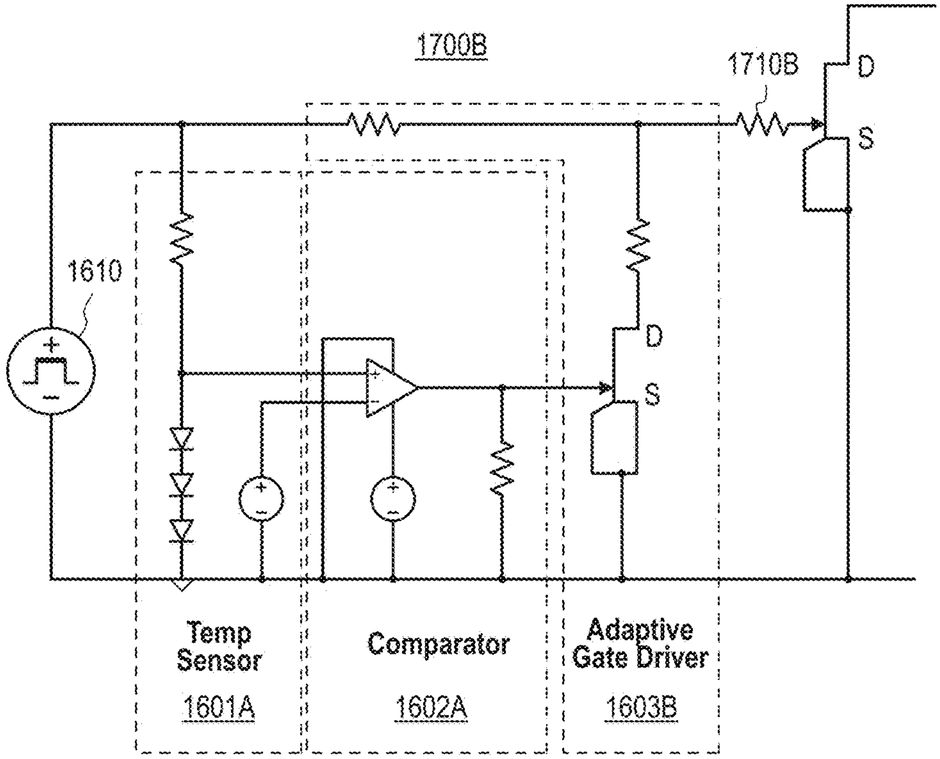
FIG. 17B illustrates a circuit that represents a second example of an implementation suitable for driving an ohmic gate contact of a HEMT transistor.

FIG. 17A is a circuit 1700A that represents an implementation of the environment 1000 of FIG. 10, which is suitable for driving a HEMT with an ohmic contact. The resistance of the gate, which may be configured internally or externally, is additionally represented by the resistor 1710A. Otherwise, the circuit 1700A is similar to the circuit 1600A of FIG. 16A. FIG. 17B is a circuit 1700B that represents an implementation of the environment 1000 of FIG. 10, which is suitable for driving a HEMT with an ohmic contact. The resistance of the gate, which may be configured internally or externally, is additionally represented by the resistor 1710B. Otherwise, the circuit 1700B is similar to the circuit 1600B of FIG. 16A.

Although various circuits have been described, the principles described herein are not limited to what circuit causes a gate terminal of the HEMT transistor to be driven at a lower magnitude at lower temperatures than at higher temperatures. Rather, the principles described herein relate to the broader concept of the temperature-dependent driving of the gate terminal of a HEMT transistor to improve the operating life of the HEMT transistor when exposed to low temperature environments.

Literal Support Section

Clause 1. A transistor circuit comprising: a gate driver circuit configured to generate a signal to drive a gate terminal of a transistor where the magnitude of the signal depends on temperature, the transistor comprising: a barrier semiconductor layer; and a channel semiconductor layer comprised of a III-Nitride semiconductor, and situated immediately beneath the barrier semiconductor layer to form a heterojunction interface with the barrier semiconductor layer, the heterojunction inducing a two-dimensional electron gas (2DEG) within the channel semiconductor layer, the gate terminal that is proximate to the 2DEG such that the signals applied by the gate driver circuit to the gate terminal control whether the 2DEG is continuous underneath the gate terminal.

Clause 2. The transistor circuit of Clause 1, the channel semiconductor layer comprising a GaN layer.

Clause 3. The transistor circuit of Clause 2, the barrier semiconductor layer comprising an AlGaN layer.

Clause 4. The transistor circuit of Clause 1, the channel semiconductor layer comprising xN, where x is Aluminum (Al), Indium (In) or Gallium (Ga) or a composition comprising any two or more of Al, In and Ga.

Clause 5. The transistor circuit of Clause 1, the transistor being an enhancement mode transistor, and having a p-doped III-Nitride semiconductor between the gate terminal of the barrier semiconductor layer.

Clause 6. The transistor circuit of Clause 5, the gate driver circuit configured to generate a voltage signal to drive the gate terminal of the transistor.

Clause 7. The transistor circuit of Clause 5, the gate driver circuit configured to generate a voltage signal to drive the gate terminal of the transistor.

Clause 8. The transistor circuit of Clause 1, further comprising: a temperature sensor configured to output a temperature signal to the gate driver circuit.

Clause 9. The transistor circuit of Clause 1, the gate driver circuit configured such that the magnitude of the signal is at a first voltage if the temperature is below a threshold, and a second voltage that is higher than the first voltage if the temperature is below the threshold.

Clause 10. The transistor circuit of Clause 9, the threshold being between minus 60 degrees Celsius and minus 20 degrees Celsius.

Clause 11. The transistor circuit of Clause 9, the first voltage being less than 90 percent of the second voltage.

Clause 12. The transistor circuit of Clause 10, the first voltage being at least 60 percent of the second voltage.

Clause 13. The transistor circuit of Clause 1, the gate driver circuit configured such that the magnitude of the signal is continuous at least for a temperature range, such that the magnitude has a positive slope with temperature within the temperature range.

Clause 14. The transistor circuit of Clause 13, a first magnitude of the signal at a lowest temperature of the temperature range being less than 90 percent of the second magnitude of the signal at a highest temperature of the temperature range.

Clause 15. The transistor circuit of Clause 14, a first magnitude of the signal at the lowest temperature of the temperature range being greater than 60 percent of the second magnitude of the signal at the highest temperature of the temperature range.

Clause 16. A method for generating a signal to drive a gate terminal of a transistor where the magnitude of the signal depends on temperature, the transistor comprising a barrier semiconductor layer, and a channel semiconductor layer composed of a III-Nitride semiconductor and situated immediately beneath the barrier semiconductor layer to form a heterojunction interface with the barrier semiconductor layer, the heterojunction inducing a two-dimensional electron gas (2DEG) within the channel semiconductor layer, the gate terminal that is proximate to the 2DEG such that the signals applied to the gate terminal control whether the 2DEG is continuous underneath the gate terminal, the method comprising: measuring a temperature of an environment in which the transistor operates; generating a temperature-dependent gate drive signal that depends on the measured temperature; and applying the temperature-dependent drive signal to the gate terminal of the transistor.

Clause 17. The method in accordance with Clause 16, the temperature-dependent gate drive signal being a current signal.

Clause 18. The method in accordance with Clause 16, the temperature-dependent gate drive signal being a voltage signal.

Clause 19. The method circuit of Clause 16, the magnitude of the temperature-dependent gate drive signal being such that a first magnitude of the temperature-dependent gate drive signal at a lowest temperature of an operating temperature range of the transistor is between 60 percent and 90 percent of a second magnitude of the temperature-dependent gate drive signal at a lowest temperature of an operating temperature range of the transistor.

Clause 20. A circuit comprising: a temperature sensor configured to generate a temperature signal that represents a temperature of an environment of the circuit; and a gate driver circuit connected to the temperature sensor and configured to generate a signal to drive a gate terminal of a transistor where the magnitude of the signal depends on the temperature signal and thus also depends on the temperature of the environment of the circuit, the transistor comprising: a barrier semiconductor layer; and a channel semiconductor layer composed of a III-Nitride semiconductor and situated immediately beneath the barrier semiconductor layer to form a heterojunction interface with the barrier semiconductor layer, the heterojunction inducing a two-dimensional electron gas (2DEG) within the channel semiconductor layer, the gate terminal that is proximate to the 2DEG such that the signals applied by the gate driver circuit to the gate terminal control whether the 2DEG is continuous underneath the gate terminal.

Although the subject matter has been described in language specific to structural features and/or methodological acts, it is to be understood that the subject matter defined in the appended claims is not necessarily limited to the described features or acts described above, or the order of the acts described above. Rather, the described features and acts are disclosed as example forms of implementing the claims.

The present disclosure may be embodied in other specific forms without departing from its essential characteristics. The described embodiments are to be considered in all respects only as illustrative and not restrictive. All changes which come within the meaning and range of equivalency of the claims are to be embraced within their scope.

When introducing elements in the appended claims, the articles "a," "an," "the," and "said" are intended to mean there are one or more of the elements. The terms "comprising," "including," and "having" are intended to be inclusive and mean that there may be additional elements other than the listed elements.

What is claimed is:

1. A transistor circuit comprising:

a gate driver circuit configured to generate a signal to drive a gate terminal of a transistor, the gate driver circuit configured to:

1) vary a magnitude of the signal based on temperature; and 2) generate the signal with a reduced magnitude for at least some temperatures below zero degrees Celsius relative to at least some temperatures above zero degrees Celsius, the transistor comprising:

a barrier semiconductor layer; and a channel semiconductor layer comprised of a III-Nitride semiconductor, and situated immediately beneath the barrier semiconductor layer to form a heterojunction interface with the barrier semiconductor layer, the heterojunction inducing a two-dimensional electron gas (2DEG) within the channel semiconductor layer, the gate terminal that is proximate to the 2DEG such that the signals applied by the gate driver circuit to the gate terminal control whether the 2DEG is continuous underneath the gate terminal.

2. The transistor circuit of claim 1, the channel semiconductor layer comprising a GaN layer.

3. The transistor circuit of claim 2, the barrier semiconductor layer comprising an AlGaN layer.

4. The transistor circuit of claim 1, the channel semiconductor layer comprising xN, where x is Aluminum (Al), Indium (In) or Gallium (Ga) or a composition comprising any two or more of Al, In and Ga.

5. The transistor circuit of claim 1, the transistor being an enhancement mode transistor, and having a p-doped III-Nitride semiconductor between the gate terminal and the barrier semiconductor layer.

6. The transistor circuit of claim 5, the gate driver circuit configured to generate a voltage signal to drive the gate terminal of the transistor.

7. The transistor circuit of claim 1, the gate driver circuit configured to generate a voltage signal to drive the gate terminal of the transistor.

8. The transistor circuit of claim 1, further comprising:

a temperature sensor configured to output a temperature signal to the gate driver circuit.

9. The transistor circuit of claim 1, the gate driver circuit configured such that the magnitude of the signal is at a first voltage if the temperature is below a threshold, and a second voltage that is higher than the first voltage if the temperature is above the threshold, the threshold being below zero degrees Celsius.

10. The transistor circuit of claim 9, the threshold being between minus 60 degrees Celsius and minus 20 degrees Celsius.

11. The transistor circuit of claim 9, the first voltage being less than 90 percent of the second voltage.

12. The transistor circuit of claim 11, the first voltage being at least 60 percent of the second voltage.

13. The transistor circuit of claim 1, the gate driver circuit configured such that the magnitude of the signal varies continuously with temperature over at least a temperature range that includes temperatures below zero degrees Celsius, such that the magnitude has a positive slope with temperature within the temperature range.

14. The transistor circuit of claim 13, wherein a first magnitude of the signal at a lowest temperature of the temperature range being less than 90 percent of a second magnitude of the signal at a highest temperature of the temperature range.

15. The transistor circuit of claim 14, wherein the first magnitude of the signal is greater than 60 percent of the second magnitude.

16. A method for generating a signal to drive a gate terminal of a transistor where a magnitude of the signal depends on temperature, the transistor comprising a barrier semiconductor layer, and a channel semiconductor layer composed of a III-Nitride semiconductor and situated immediately beneath the barrier semiconductor layer to form a heterojunction interface with the barrier semiconductor layer, the heterojunction inducing a two-dimensional electron gas (2DEG) within the channel semiconductor layer, the gate terminal that is proximate to the 2DEG such that the signals applied to the gate terminal control whether the 2DEG is continuous underneath the gate terminal, the method comprising:

measuring a temperature of an environment in which the transistor operates;

generating a temperature-dependent gate drive signal that depends on the measured temperature; and applying the temperature-dependent drive signal to the gate terminal of the transistor, wherein the magnitude of the temperature-dependent gate drive signal is reduced for at least some temperatures below zero degrees Celsius relative to at least some temperatures above zero degrees Celsius.

17. The method in accordance with claim 16, the temperature-dependent gate drive signal being a current signal.

18. The method in accordance with claim 16, the temperature-dependent gate drive signal being a voltage signal.

19. The method of claim 16, the magnitude of the temperature-dependent gate drive signal being such that a first magnitude at a lowest temperature of an operating temperature range of the transistor is between 60 percent and 90 percent of a second magnitude at a highest temperature of the operating temperature range.

20. A circuit comprising:

a temperature sensor configured to generate a temperature signal representing a temperature of an environment of the circuit; and a gate driver circuit connected to the temperature sensor and configured to generate a signal to drive a gate terminal of a transistor, a magnitude of the signal depends on the temperature signal and being reduced for at least some temperatures below zero degrees Celsius relative to at least some temperatures above zero degrees Celsius, the transistor comprising: a barrier semiconductor layer; and a channel semiconductor layer composed of a III-Nitride semiconductor and situated immediately beneath the barrier semiconductor layer to form a heterojunction interface with the barrier semiconductor layer, the heterojunction inducing a two-dimensional electron gas (2DEG) within the channel semiconductor layer, the gate terminal that is proximate to the 2DEG such that the signals applied by the gate driver circuit to the gate terminal control whether the 2DEG is continuous underneath the gate terminal.

* * * * *